(12) United States Patent
Natarajan et al.

(10) Patent No.: US 6,562,169 B2
(45) Date of Patent: May 13, 2003

(54) MULTI-LEVEL WEB STRUCTURE IN USE FOR THIN SHEET PROCESSING

(75) Inventors: Govindarajan Natarajan, Pleasant Valley, NY (US); Raschid J. Bezama, Mahopac, NY (US); Jon A. Casey, Poughkeepsie, NY (US); Amy C. Flack, Millbrook, NY (US); Robert W. Pasco, Wappingers Falls, NY (US); Arnold W. Terpening, New Paltz, NY (US); Renee L. Weisman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 09/765,027

(22) Filed: Jan. 17, 2001

(65) Prior Publication Data

US 2002/0092600 A1 Jul. 18, 2002

(51) Int. Cl.⁷ .................... B32B 31/18; B32B 31/26
(52) U.S. Cl. .................. 156/89.12; 156/89.16; 156/247; 156/248; 156/252; 156/253
(58) Field of Search .................. 156/89.11, 89.12, 156/89.16, 247, 248, 249, 252, 253

(56) References Cited

U.S. PATENT DOCUMENTS

| | | | | |
|---|---|---|---|---|
| 3,879,509 A | * | 4/1975 | Elderbaum | |
| 4,677,254 A | * | 6/1987 | Boss et al. | |
| 4,802,945 A | * | 2/1989 | Opina | 156/247 |
| 5,085,720 A | * | 2/1992 | Mikeska et al. | |
| 5,271,150 A | * | 12/1993 | Inasaka | |
| 6,042,667 A | * | 3/2000 | Adachi et al. | 156/247 |
| 6,217,990 B1 | * | 4/2001 | Asai et al. | |

* cited by examiner

Primary Examiner—Curtis Mayes
(74) Attorney, Agent, or Firm—Tiffany L. Townsend

(57) ABSTRACT

A method of processing greensheets, wherein the following steps are performed:
  a) providing a greensheet having a width, length, thickness, a first side and a second side;
  b) bonding to the first side of the greensheet at least one strip, wherein the strip lies in a first plane;
  c) bonding to the second side of the green sheet at least one strip, wherein the strip lies in a second plane;
  d) processing the greensheet; and
  e) removing the strips from the processed greensheet.

15 Claims, 4 Drawing Sheets

MULTI-LEVEL WEB STRUCTURE IN USE FOR THIN SHEET PROCESSING

FIELD OF THE INVENTION

The present invention is directed to the processing of semiconductor and more particularly to the processing of greensheets used to make ceramic substrates for microelectronic components.

DESCRIPTION OF RELATED ART

In the ceramic electronics industry, multilayer ceramic (MLC) technology is typically used to create three-dimensional circuitry in ceramic substrates for microelectronic devices such as integrated circuits and ceramic capacitors. The three-dimensional circuitry in the ceramic substrate is made by applying a conductive material in a circuit pattern on a ceramic/polymer composite sheet. The ceramic/polymer composite sheet is known as a "greensheet" and may have a number of via holes punched in it to allow vertical connection between the conductive material on adjacent sheets. After the vias are punched, the greensheets are screened and patterned by applying a conductive paste into the via holes and along the surface of the greensheet. The screening is typically done utilizing a mask applied over the individual greensheet. The greensheets are then generally stacked in a designated order and laminated together under appropriate heat and pressure to form a laminate which can be handled as a unified structure. To produce the final ceramic material, the laminated ceramic/polymer composite is fired, i.e. heated, to remove the polymer, followed by heating to higher temperature to sinter and densify the ceramic. MLC technology has developed to incorporate advanced technologies and groundrules, i.e., triple dense conductors, thin green sheets and large area greensheets. However, in the course of adopting such new technologies, greensheet stability has become a concern. In particular, radial error of the through holes can and does contribute to misalignment of the conductive vias and other features. The radial error is the radial distance between the actual location of the via and the design location of the via. The reference is arbitrarily set but the center of the pattern is usually chosen. The use of one or more of these advanced technologies in a multilayer package, where the individually punched and screened sheets are stacked adjacent to each other to form the laminate, is possible only if the via holes can be punched and screened with a small radial error. It would be especially desirable if this radial error were less than 30 microns. Bearing in mind the problems and deficiencies of the prior art, it is therefore an object of the present invention to provide an improved via-punched and screened greensheet for use with advanced groundrules, thin green sheets and large area greensheets. It is another object of the present invention to provide an improved greensheet and processing method which reduces radial error of the screened greensheet. A further object of the invention is to provide a process and system to make greensheet via alignment more precise in stacked greensheet laminates.

SUMMARY OF THE INVENTION

It is an object of the invention to provide a screening method which reduces the greensheet shrinkage caused by the drying of the via paste. It is another object of the instant invention to provide a method of strengthening thin greensheets for better performance. It is yet another object of the instant invention to provide a method of processing uncured greensheets.

The above and other objects and advantages, which will be apparent to one of skill in the art, are achieved in the present invention which is directed to, in a first aspect, a method of processing greensheets, wherein the user provides a greensheet having a width, length, thickness, a first side and a second side, then bonding the first side of the greensheet at least one strip, wherein the strip lies in a first plane, then bonding to the second side of the green sheet at least one strip, wherein the strip lies in a second plane, then processing the greensheet; and finally removing the strips from the processed greensheet.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

In describing the preferred embodiments of the present invention, reference will be made herein to FIGS. 1–7.

Thin greensheets as understood in the MLC processes can be defined as greensheets with a thickness of less than about 6 mils. The size of the sheets in the x-y directions can vary substantially (150 mm–600 mm). Thin greensheets are very flimsy by nature and can be difficult to blank, punch and/or screen. As MLC product groundrules change, the industry is slowly trying to move toward the use of personalized thin dielectrics to meet the increased impedance and inductance requirements of the new generations of MLC products.

Personalizing thin greensheets presents challenges. The maximum radial error for punched and screened thin greensheets can be as high as 250 microns. Radial errors of that magnitude are well outside of the desirable range and therefore there has not been large scale use of thin greensheets. Current generation technology prefers a maximum radial error of about 50 microns, and preferably a radial error of less than 30 microns.

The instant invention provides a supporting structure for greensheets, thin or thick, that renders them less flimsy and eliminates the need for curing the greensheets prior to use. Since the greensheets do not have to be cured a significant time/cost savings can be realized with the instant invention.

Figure 1:
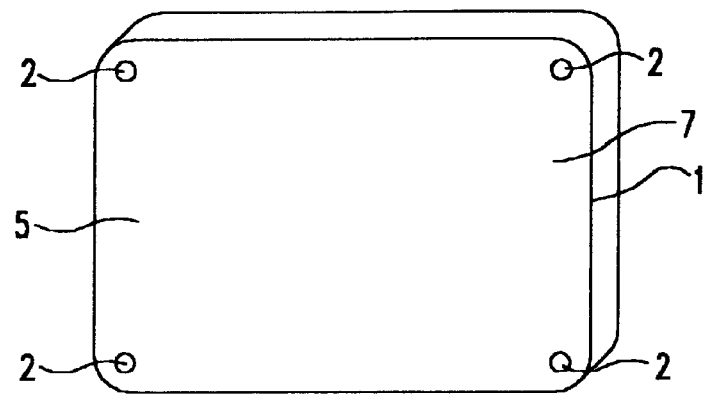
FIG. 1 is a top down view of a typical greensheet prior to processing.
Figure 2A:
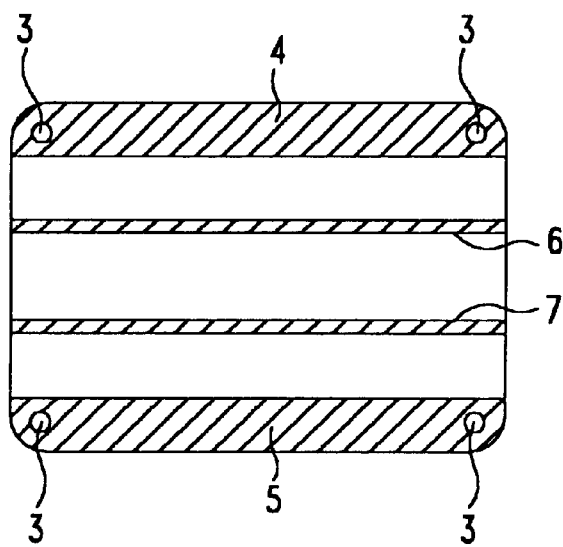
FIGS. 2a and 2b are front and back view of a greensheet after performing one embodiment of the instant method.
Figure 2B:
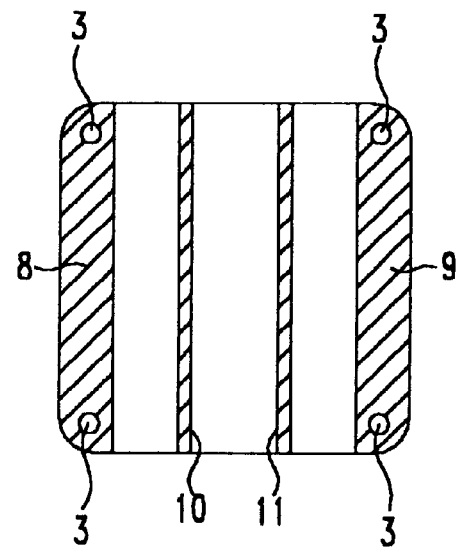

A typical greensheet will have location holes, 2, as shown in FIG. 1. The greensheet, 1, can be comprised of any number of materials. Typically, a greensheet will be comprised of alumina, glass ceramic, aluminum nitride or borosilicate glass based glass ceramics. Greensheets can also be made from polymer based materials. Each greensheet, 1, will have a front side (FRONT), 5 and a back side (BACK), 7. Strips will be overlayed and bonded to the FRONT and BACK surfaces of the greensheet. As shown in FIG. 2a, a first set of strips (a–d) will be bonded to the FRONT of the greensheet and as shown in FIG. 2b, a second set of strips (e–h) will be bonded to the back of the greensheet. The set of strips on the FRONT will lie in different horizontal and vertical plane than the strips on the BACK. Subsets of the overall areas, volumes, of the greensheet will be created by the strips as will be shown later. The strips in all of the embodiments of the instant invention may be comprised of different materials. Typical materials for the strips include metals like molybdenum, stainless steel, nickel and aluminum, polymers, paper and other fibrous and/or solid and/or porous materials. The strips can be attached to the greensheets by any means known in the art but would preferably be laminated on the greensheets. The roughness of the strips would preferably be about 500 Å to 4000 Å. Preferably, the strips would be comprised of a material that had a coefficient of thermal expansion that was as close to the greensheet material coefficient of thermal expansion as possible. It is should be noted that the strips on different sides, FRONT and BACK, can comprise different materials. Strips on the same side can be different widths as can strips on opposing FRONT/BACK sides as is shown throughout the embodiments. Similarly, the strips can be of any thickness. However, it is preferable if the thickness of the strips does not exceed the thickness of the greensheet. Even more preferably, the thickness of the strips would be less than about 1 mil. It should noted again, that each strip thickness is determined individually and there is not stipulation that strips on the same side be the same thickness or that strips on opposing sides be the same thickness. The strips when properly placed reduce the shrinkage and warping associated with via paste drying and provide a more uniform greensheet with a higher yield.

Figure 3:
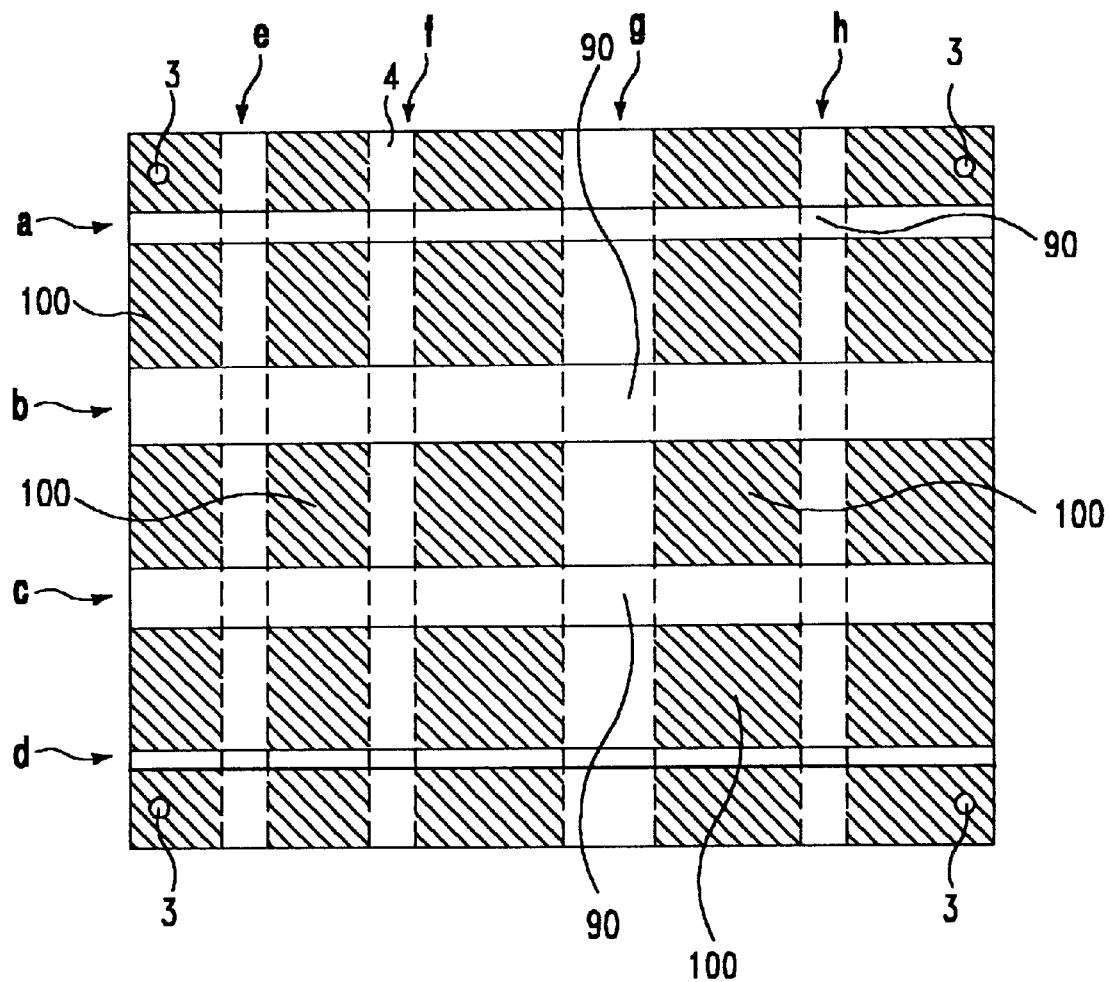
FIG. 3 is a top down view of a patterned and screened greensheet after performing the method of the instant invention.

In the first embodiment of the instant invention, each member of the set of strips on the FRONT of the greensheet will be parallel to each other, as will each member of the set of strips on the BACK of the greensheet. The relationship between the opposing strips on the FRONT and BACK of the sheets may vary. The opposing FRONT and BACK strips should form quadrangles, 100, as shown in FIG. 3, where the strips from the BACK are shown as dashed lines. Since this first embodiment has required that the strips on each of the FRONT and BACK side be parallel to each other the intersections of the strips, 100, will necessarily form quadrangles which are orthogonal. When the areas within the volumes created are punched and screened they show an acceptable radial error, in some cases as much as a tenfold reduction in radial error.

A close inspection of the intersection of the strips, 90, shows that this embodiment creates at least one subarea, a volume, shown by the angles in a given set of two FRONT strips and two BACK strips. A volume, 100, is not formed by the intersection of the two sets of strips because the strips are in different planes and do not intersect. The only limitation on the size of a volume, 100, is that it must be large enough to accommodate the user define pattern that is to be punched and screened in that volume area.

Figure 4:
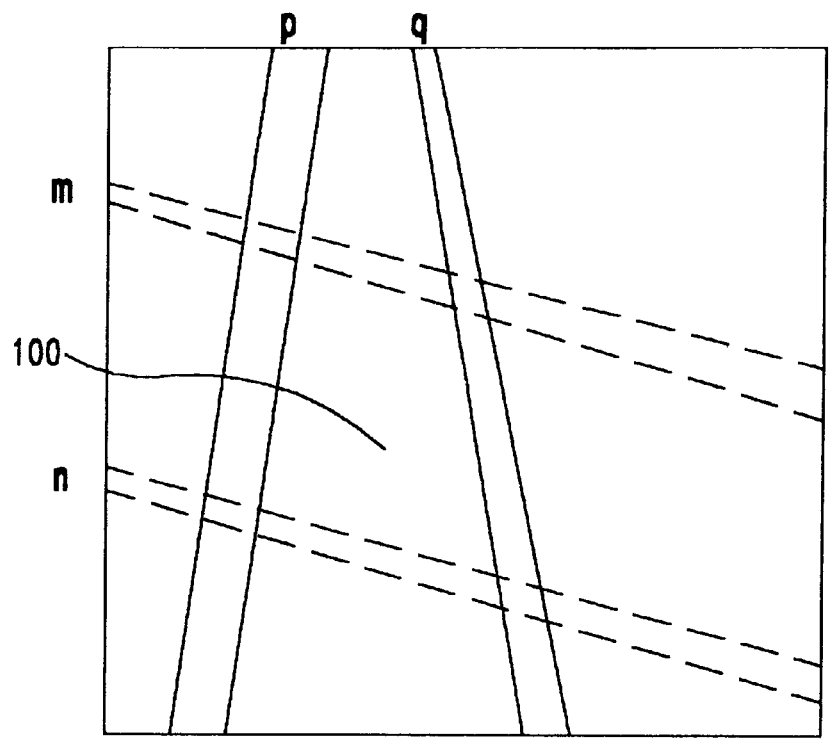
FIGS. 4 and 5 are top down views showing other methods of the instant invention.

In a second embodiment, as shown in FIG. 4, the strips on either or both of the FRONT, (m,n) and BACK (p,q) sides are not parallel to others on the same side, but strips on the same side do not intersect. Quadrangles, 100, are still formed in this instance but are not necessarily orthogonal. Any shape quadrangle is acceptable as long as the volume is large enough to accommodate the user defined pattern to be punched and screened in that volume. However, it should be noted that the error is not optimally reduced with this placement of the strips.

Figure 5:
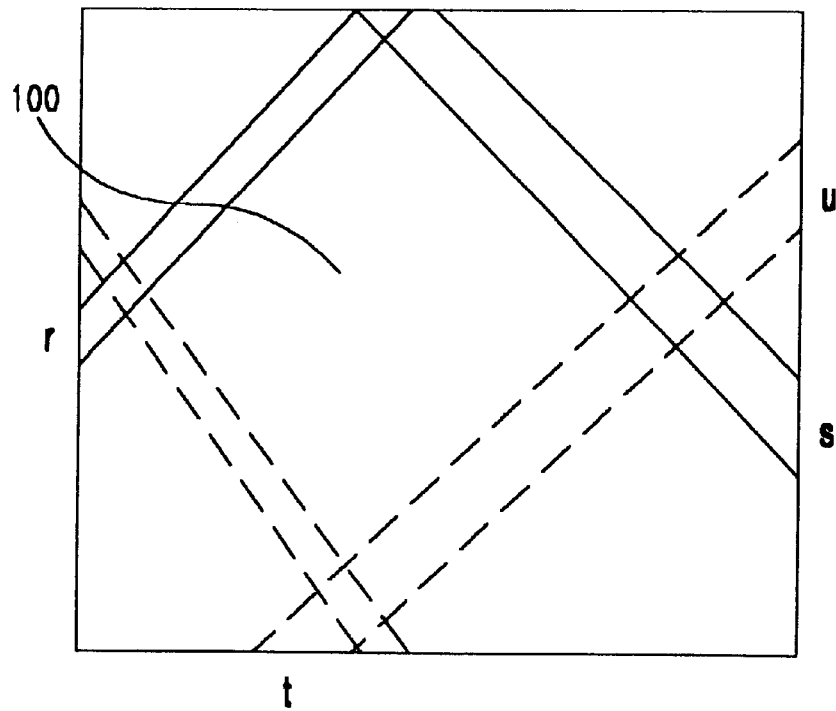

In a third embodiment, strips on the FRONT and BACK sides would not only not be parallel but the strips on the same FRONT or BACK side would intersect. That is to say that the strips on the FRONT or BACK sides would not form opposite sides of the quadrangle, but adjacent sides as shown in FIG. 5. In this embodiment, the volume, 100 is formed and can be shaped as it was in the first and second embodiments, as shown in FIG. 5.

It should also be noted that the individual sheets, once punched and screened might also be stacked. In the instant invention it is not necessary that each layer have the same strip alignment or volume. It is only necessary that once the greensheet is cut that the strips, if any do remain, do not significantly affect the functioning of the MLC. It is preferable that no strips remain after cutting. It is also preferable if each volume on each level is equal and the strip alignment substantially similar. The greensheets can be cut before or after sintering.

Figure 6:
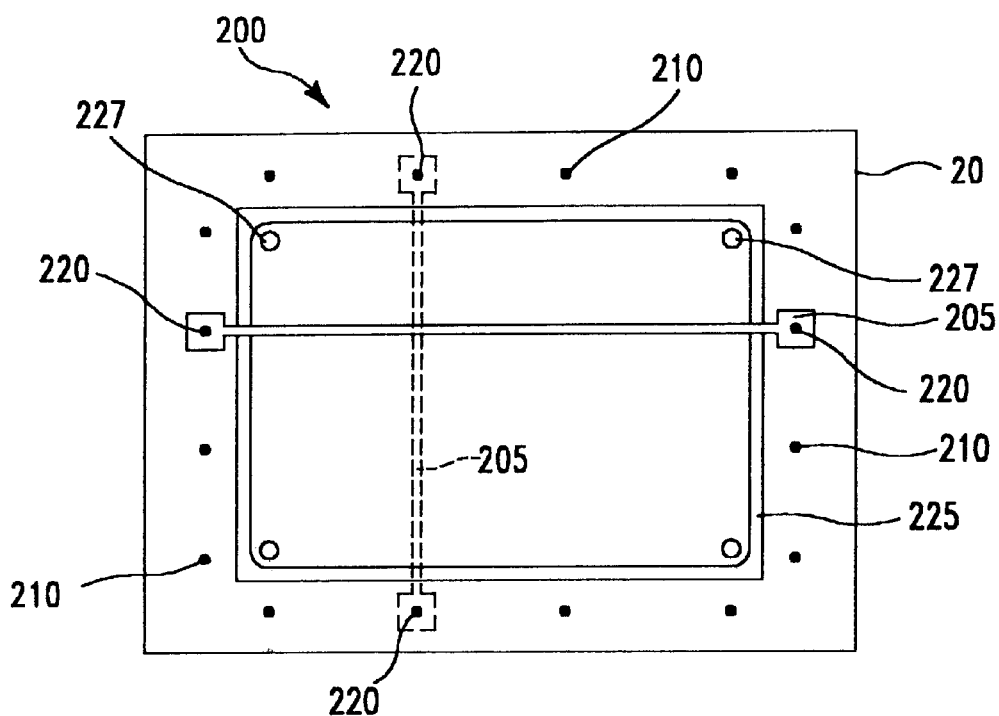
FIGS. 6 and 7 are top down views of one frame used to perform some embodiments of the method of the instant invention.

This invention also contemplates an apparatus to place the strips on a greensheet. The apparatus, an alignment fixture, 200, comprises an outer frame, 202, as shown in FIG. 6. Each of the four sides would have catches, 210, usually pins, that would attach to a portion of the strips, usually one of two terminal ends, 220, of each of the strips, 205. A support plate, 225, which has pins, 227, to help align the greensheet, is contained within the frame. A greensheet spacer, usually a mylar sheet (not shown) is placed on the support plate, 225, to separate the greensheet from the support plate. The set of strips for the BACK or the FRONT of the greensheet are then attached, usually horizontally or vertically. Each of the strips, 205, has two portions, 220, which are attached to opposing sides of the alignment fixture, 200. The greensheet (not shown) is then placed on the support plate, 225, and aligned using the pins, 227. The other of the FRONT or BACK strips, 205, would then be attached by the portions, 220, to the alignment fixture catches, 210. Next another greensheet spacer, again usually a mylar sheet would be placed (not shown). The entire structure would then preferably be laminated. In a preferred embodiment, the lamination would take place at a pressure between 300–1000 psi and a temperature of about 40–90° C. Preferably the time interval would be less than about 4 minutes.

Figure 7:
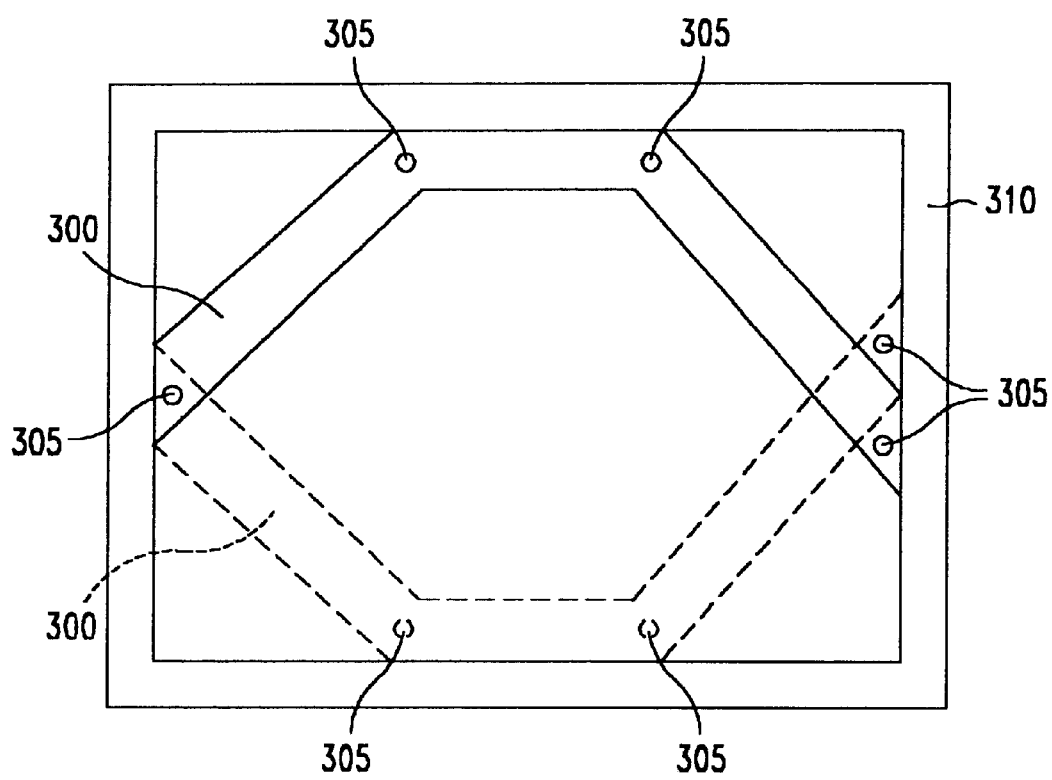

The method of forming the volume structure can be done independently of the apparatus shown above. Disclosure of the apparatus should make it obvious that the strips could be segmented and that a strip does not have to be connected to a frame. The length of the strip is determined by the application sought by the end user. Segmented strips use could be useful as a cost savings measure. The disclosure of the apparatus should make it obvious that the inventors contemplated volume shapes that were not quadrangles and strip shapes that were not linear. For example, as shown in FIG. 7, the FRONT and BACK strips, 300, would have multiple connection points, 305, and would fit into the alignment fixture, 310, as shown. The strip shape shown in FIG. 7 is just one example of a strip shape and strip shapes with any number of connection points which create a final volume useful to the end user can be achieved.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of processing greensheets, comprising:
   providing a greensheet having a width, length, thickness, a first side and a second side; bonding to the first side of the greensheet at least one strip, wherein the strip lies in a first plane; bonding to the second side of the green sheet at least one strip, wherein the strip lies in a second plane and wherein at least one strip on the first side is orthogonal to at least one strip on the second side;
   processing the greensheet comprising punching vias in the greensheet; and
   removing the strips from the processed greensheet.

2. The method of claim 1 wherein the processing of the greensheet further comprises filling the vias in the greensheet with a conductive material.

3. The method of claim 2 wherein the processing of the greensheet further comprises patterning the greensheet by applying conductive paste to the vias and the greensheet surface.

4. The method of claim 3 wherein the processing of the greensheet further comprises stacking the patterned greensheet with at least one strip containing patterned greensheet and laminating the greensheets.

5. The method of claim 4 wherein the strips are removed from each of the first and second sides of the greensheet after laminating the greensheets.

6. The method of claim 5 wherein the strips are removed from the processed greensheet after laminating the greensheets, and wherein the laminated greensheets are sintered.

7. The method of claim 1 wherein the bonding of the strips to the greensheet is by lamination.

8. The method of claim 1 wherein the strips form a plurality of volumes, each volume defining a constrained active area.

9. The method of claim 1 wherein the strips comprise a material selected from the group consisting of metals, polymers, ceramics, cellulosics and composites thereof.

10. The method of claim 9 wherein the strips comprise a metal selected from the group consisting of molybdenum, stainless steel, titanium, nickel, tungsten and aluminum.

11. The method of claim 1 further comprising at least two strips on each of the first and second sides and wherein each of the strips on the first and second sides are parallel to all of the other strips on that same side.

12. The method of claim 1 further comprising at least two strips on each of the first and second sides and wherein each of the strips on the first and second sides are not parallel to all of the other strips on that same side and wherein each of the strips on each of the first and second sides do not intersect other strips on the same side.

13. The method of claim 1 wherein the bonding comprises
   a) placing the strips for the first side of the greensheet in a frame, the frame constraining the strips in a first pattern;
   b) placing the greensheet in the frame, the frame constraining the greensheet such that the greensheet has a known orientation; and
   c) placing the strips for the second side of the greensheet in the frame, the frame constraining the second side strips in a second pattern.

14. The method of claim 13 wherein the bonding further comprises laminating the framed greensheets.

15. The method of claim 14 wherein the bonding further comprising removing the laminated strip containing greensheet from the frame.

* * * * *